(12) United States Patent
Kejariwal et al.

(10) Patent No.: US 7,202,746 B1
(45) Date of Patent: Apr. 10, 2007

(54) MULTIPLE-STAGE OPERATIONAL AMPLIFIER AND METHODS AND SYSTEMS UTILIZING THE SAME

(75) Inventors: Murari Kejariwal, Austin, TX (US); Gowtham Vemulapalli, Austin, TX (US); John Laurance Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 142 days.

(21) Appl. No.: 11/011,443

(22) Filed: Dec. 14, 2004

(51) Int. Cl.
*H03F 3/04* (2006.01)

(52) U.S. Cl. .............. 330/301; 330/310; 330/302; 330/294

(58) Field of Classification Search ............ 330/301, 330/310, 302, 294, 109
See application file for complete search history.

(56) References Cited

U.S. PATENT DOCUMENTS

| | | | | |
|---|---|---|---|---|
| 4,524,327 A | * | 6/1985 | Masuda et al. ............ | 330/253 |
| 4,559,502 A | * | 12/1985 | Hiujsing ................... | 330/297 |
| 4,908,566 A | * | 3/1990 | Tesch ....................... | 323/280 |
| 5,115,202 A | | 5/1992 | Brown | |
| 5,880,634 A | * | 3/1999 | Babanezhad .............. | 330/126 |
| 6,140,879 A | * | 10/2000 | Morrish .................... | 330/311 |
| 6,201,835 B1 | | 3/2001 | Wang | |
| 6,307,430 B1 | | 10/2001 | Thomsen | |
| 6,778,017 B2 | * | 8/2004 | Analui et al. ............ | 330/292 |

* cited by examiner

*Primary Examiner*—Patricia Nguyen
(74) *Attorney, Agent, or Firm*—James J. Murphy; Thompson & Knight, LLP

(57) ABSTRACT

A multiple-stage operational amplifier including a gain stage for amplifying an input signal and implementing a dominant pole producing a frequency response having a gain roll-off with frequency and a unity gain frequency. An intermediate stage is coupled to an output of the gain stage and has a high input impedance and a low output impedance. A high gain amplifier configured as a low gain output stage using resistive feedback and coupled to an output of the intermediate stage drives an output of the operational amplifier and implements a dominant pole at a frequency substantially higher than the unity gain frequency implemented by the dominant pole implemented the gain stage.

21 Claims, 5 Drawing Sheets

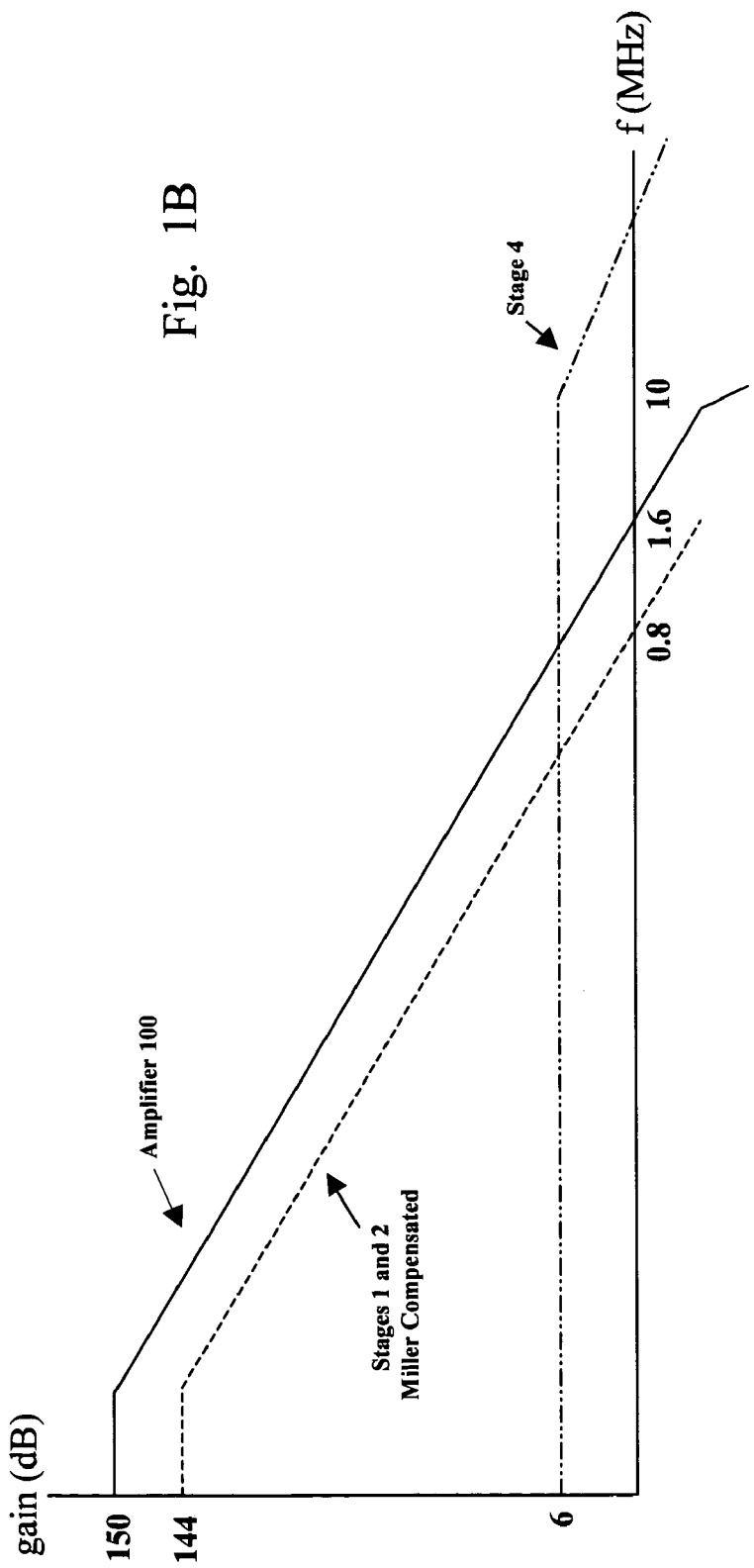

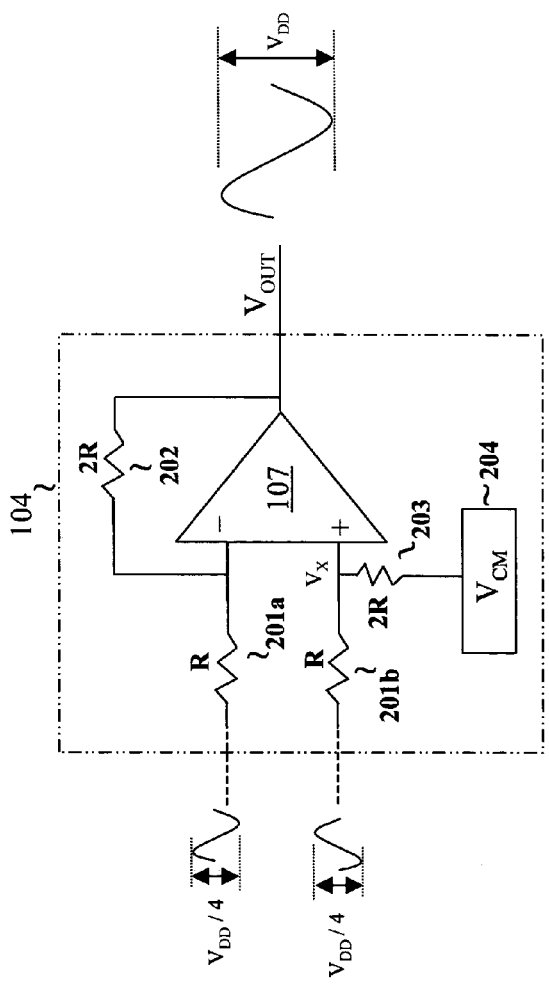
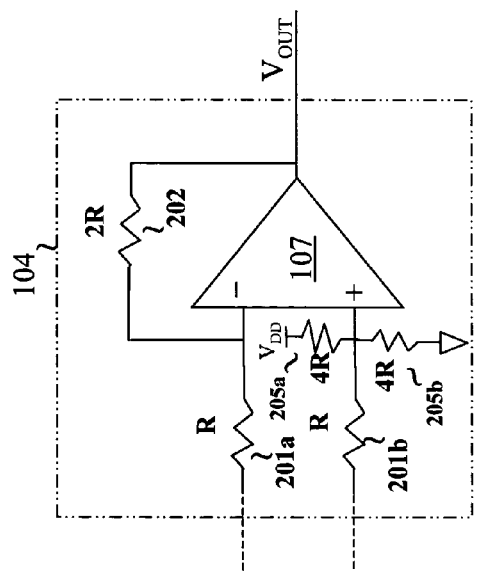
Fig. 2A
Fig. 2B

MULTIPLE-STAGE OPERATIONAL AMPLIFIER AND METHODS AND SYSTEMS UTILIZING THE SAME

FIELD OF INVENTION

The present invention relates in general to linear circuit techniques, and in particular to multiple-stage operational amplifiers and methods and systems utilizing the same.

BACKGROUND OF INVENTION

Multiple-stage operational amplifiers (opamps) typically include a cascade of one or more gain stages and an output driver stage for driving an output load. The output stage is, for example, a Class AB amplifier that provides high low-frequency gain. To achieve an overall high open loop gain (e.g. greater than 150 dB), a multiple-stage opamp normally requires three or more gain stages.

The design of multiple-stage opamps with three or more gain stages presents significant design challenges. For example, to achieve unconditional stability, a relatively complex nested Miller frequency compensation scheme must often be used. In the nested Miller frequency compensation scheme, as each new gain stage is added to the system, an additional nested Miller capacitor is added between the opamp output and the inputs to the amplifier of the previous stage in the cascade to produce pole-splitting. For example, in a three-stage amplifier, a first feedback capacitor is provided between the opamp output and the input to the last stage and a second feedback capacitor is provided between the opamp output and the input to the second stage in the cascade. In addition, increasing the complexity of the circuitry, nested Miller compensation also disadvantageously reduces the overall opamp bandwidth and increases the load on the opamp output thereby imposing increased power requirements on the last stage.

In order to design and fabricate less complicated, smaller, and less expensive opamps, an alternative technique to the nested Miller compensated scheme is required. This technique should provide high opamp gain while maintaining stability, and should be suitable for low power opamp applications.

SUMMARY OF INVENTION

The principles of the present invention are embodied in multiple-stage operational amplifiers, which advantageously do not require nested Miller frequency compensation to remain stable across a relatively wide frequency bandwidth. According to one particular embodiment, a multiple-stage operational amplifier is disclosed, which includes a gain stage for amplifying an input signal and implementing at least one dominant pole producing a signal frequency response having a gain roll-off with frequency and a unity gain frequency. A low gain (e.g. having a nominal gain of more than one and a half [1.5] dB and less than ten [10] dB) output stage, and which is coupled to the gain stage through an intermediate stage, drives an output of the operational amplifier and implements a dominant pole at a frequency substantially higher than the unity gain frequency produced by the pole of the gain stage. The intermediate stage comprises an approximately unity gain amplifier with high input impedance and low output impedance.

The principles of the present invention are also embodied in techniques for setting the common mode voltage of the output stage of a multiple-stage operational amplifier, which advantageously reduce device power consumption. For example, the intermediate stage reduces the load on the gain stage. Additionally, an output stage having a closed-loop configuration provides low output impedance and rail-to-rail voltage swing.

BRIEF DESCRIPTION OF DRAWINGS

For a more complete understanding of the present invention, and the advantages thereof, reference is now made to the following descriptions taken in conjunction with the accompanying drawings, in which:

FIG. 1B is a gain versus frequency plot generally describing the operational characteristics of the multiple-stage operational amplifier of FIG. 1A;

FIG. 2A is a schematic diagram of one possible driver circuit suitable for utilization in the output driver stage of the multiple-stage operational amplifier of FIG. 1A;

FIG. 2B is a schematic diagram of an exemplary driver circuit according to the principles of the present invention and suitable for utilization in the output driver stage of the multiple-stage operational amplifier of FIG. 1A

DETAILED DESCRIPTION OF THE INVENTION

The principles of the present invention and their advantages are best understood by referring to the illustrated embodiment depicted in FIGS. 1–3 of the drawings, in which like numbers designate like parts.

Figure 1A:
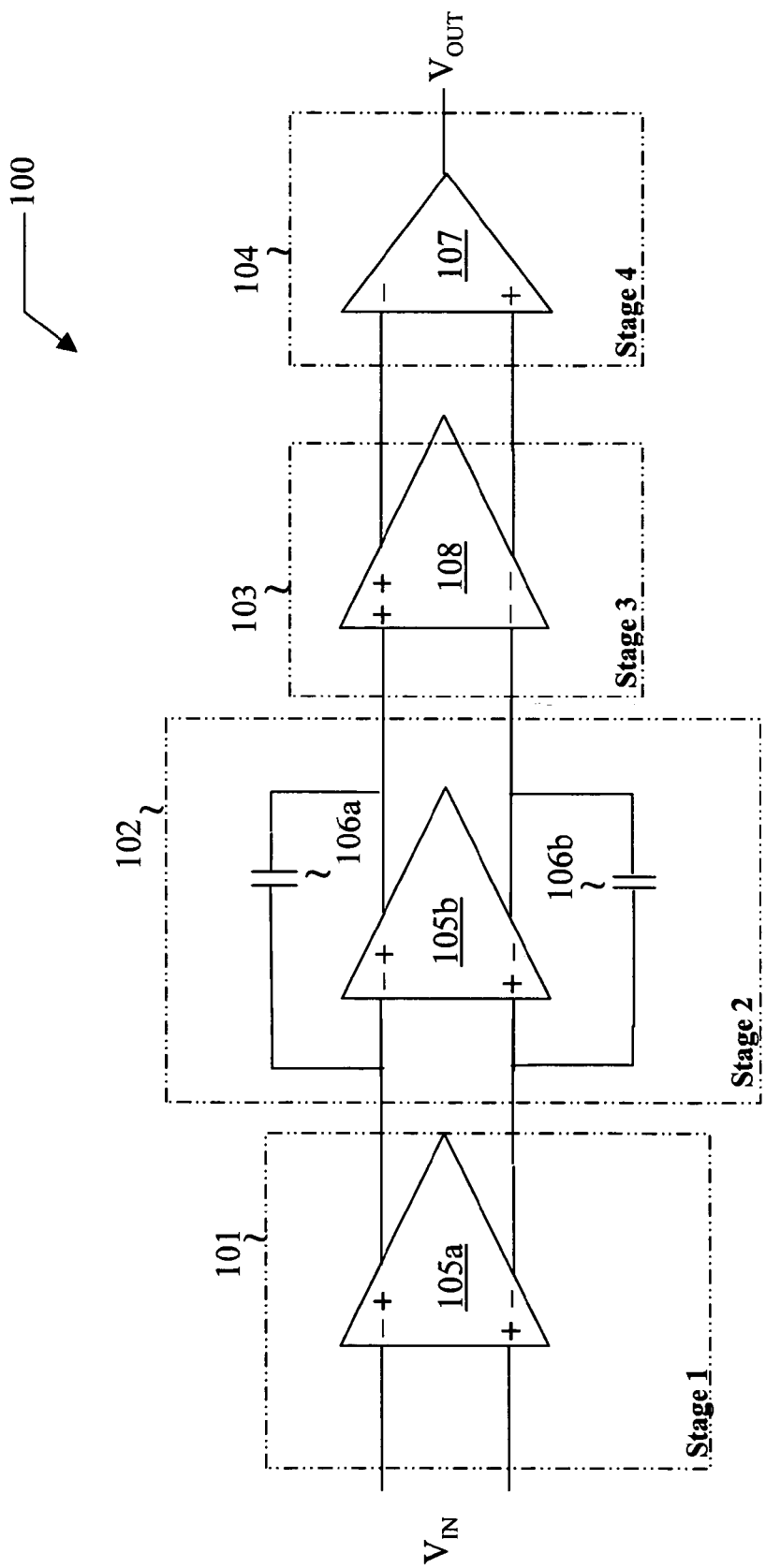
FIG. 1A is a high level block diagram of an exemplary multiple-stage operational amplifier suitable for demonstrating the principles of the present invention.

FIG. 1A is a high-level block diagram of an exemplary multiple-stage operational amplifier (opamp) 100 embodying the principles of the present invention. Opamp 100 includes two (2) gain stages 101 and 102, an intermediate stage 103, and an output driver stage 104, although in alternate embodiments the number of gain stages may vary.

First gain stage 101, which includes an amplifier 105a, controls the input characteristics of opamp 100. In one embodiment, amplifier 105a of first gain stage 101 includes parallel NMOS and PMOS input transistors such that the input signal $V_{IN}$ can swing from rail to rail (i.e. 0 v to $V_{DD}$). In the illustrated embodiment first gain stage 101 provides a low frequency gain of greater than 80 dB. Second gain stage 102 includes an amplifier 105b and Miller compensation capacitors 106a and 106b implementing dominant pole compensation for the combined amplifier stages 101 and 102. In the illustrated embodiment, second gain stage 102 provides a gain of greater than 70 dB. Additionally, while Miller compensation capacitors 106a and 106b in the embodiment of FIG. 1A are shown coupling the inputs of second gain stage 102 and the inputs of following intermediate stage 103, in alternate embodiments compensation capacitors 106a and 106b couple the inputs of second gain stage 102 and the outputs of intermediate stage 103, as discussed below in conjunction with FIG. 3B.

Together, first and second gain stages 101 and 102 provide an open loop gain greater than 150 db and a closed loop roll-off frequency response of nominally −20 dB/decade, such that the cascade of first and second gain stages 101 and 102 is unconditionally stable. Intermediate stage 103, which is based on an amplifier 108, has approximately unity gain, wide bandwidth, very high input impedance and low output impedance. Intermediate stage 103 does not modify the frequency response of first and second stages 101 and 102; however, the cascade of stages 101, 102, and 103 has a low output impedance. Advantageously, intermediate stage 103 operates as a buffer such that following output driver stage 104 does not overload second gain 102. By avoiding such overloading, the gain of second gain stage 102 is maximized.

Output driver stage 104 includes an opamp 107, with inverting (−) and non-inverting (+) differential inputs and a single-ended output driving the opamp 100 output signal $V_{OUT}$. In the illustrated embodiment, output driver stage 104 includes a class AB amplifier with an independent closed loop. With respects to overall multiple-stage opamp 100, output driver stage 104 operates open-loop, and therefore has a low gain, of approximately 6 dB, to ensure multiple-stage opamp 100 is stable. Additionally, output driver stage 103 performs differential to single-ended conversion.

To avoid nested Miller compensation within opamp 100, output driver stage 104 implements a dominant pole at a frequency much higher than the unity gain frequency of the frequency response produced by gain stages 101, 102 and intermediate stage 103. Specifically, output driver is a two-stage amplifier having dominant pole frequency compensation and a roll-off of −20 dB/decade in closed-loop.

FIG. 1B is a gain versus frequency plot generally describing the operational characteristics of multiple-stage operational amplifier 100 of FIG. 1A. As shown by the dashed line in FIG. 1B, first and second gain stages 101 and 102 provide high gain and implement a conventional dominant pole compensation scheme. Output driver stage 104, as represented by the broken line, has a low-gain across a wide frequency band and provides a high output voltage swing and low output impedance. The dominant pole introduced by output stage 104 is at a frequency of approximately 10 MHz, in the embodiment described in FIG. 1B, which is well above the 800 KHz unity gain frequency of the frequency response of first and second stages 101 and 102.

FIG. 2A is an electrical schematic diagram of an exemplary implementation of output driver 104. Here, the common mode voltage $V_{CM}$ must be invariant in response to changes in the voltage $V_X$ at the non-inverting input of opamp 107. In particular, the common mode voltage supply 204 must be capable of sourcing and/or sinking current flowing through feedback resistor 202 caused by variations in the voltage $V_x$ at the non-inverting input of opamp 107. Specifically, the maximum current common mode voltage supply 204 must be able to source and/or sink is $V_{DD}/(R+2R)$. Hence, common mode voltage supply 204 must have very low load impedance, which dictates higher current consumption to maintain a constant value of $V_{CM}$.

An alternate embodiment of output driver 104, which reduces current consumption during the generation of $V_{CM}$, is shown in FIG. 2B. In FIG. 2B, resistors 205a and 205b, each of a value of 4R, are added at the non-inverting terminal of amplifier 107. The Thevenin equivalent of the voltage source $V_{DD}$ and resistors 205a and 205b is determined by setting the differential input voltage $V_{IN}$ to zero (0). The voltage at the non-inverting terminal of opamp 107 provided by the voltage divider formed by resistors 205a and 205b is then $V_{DD}/2$. In the illustrated embodiment, the common mode voltage $V_{CM}$ is also $V_{DD}/2$, therefore for no current flows through resistor 201b. The current through resistors 205a and 205b is only $V_{DD}/8$, and the common mode voltage $V_{CM}$ is still constant during variations of the voltage $V_X$ at the non-inverting terminal of opamp 107.

Figure 3A:
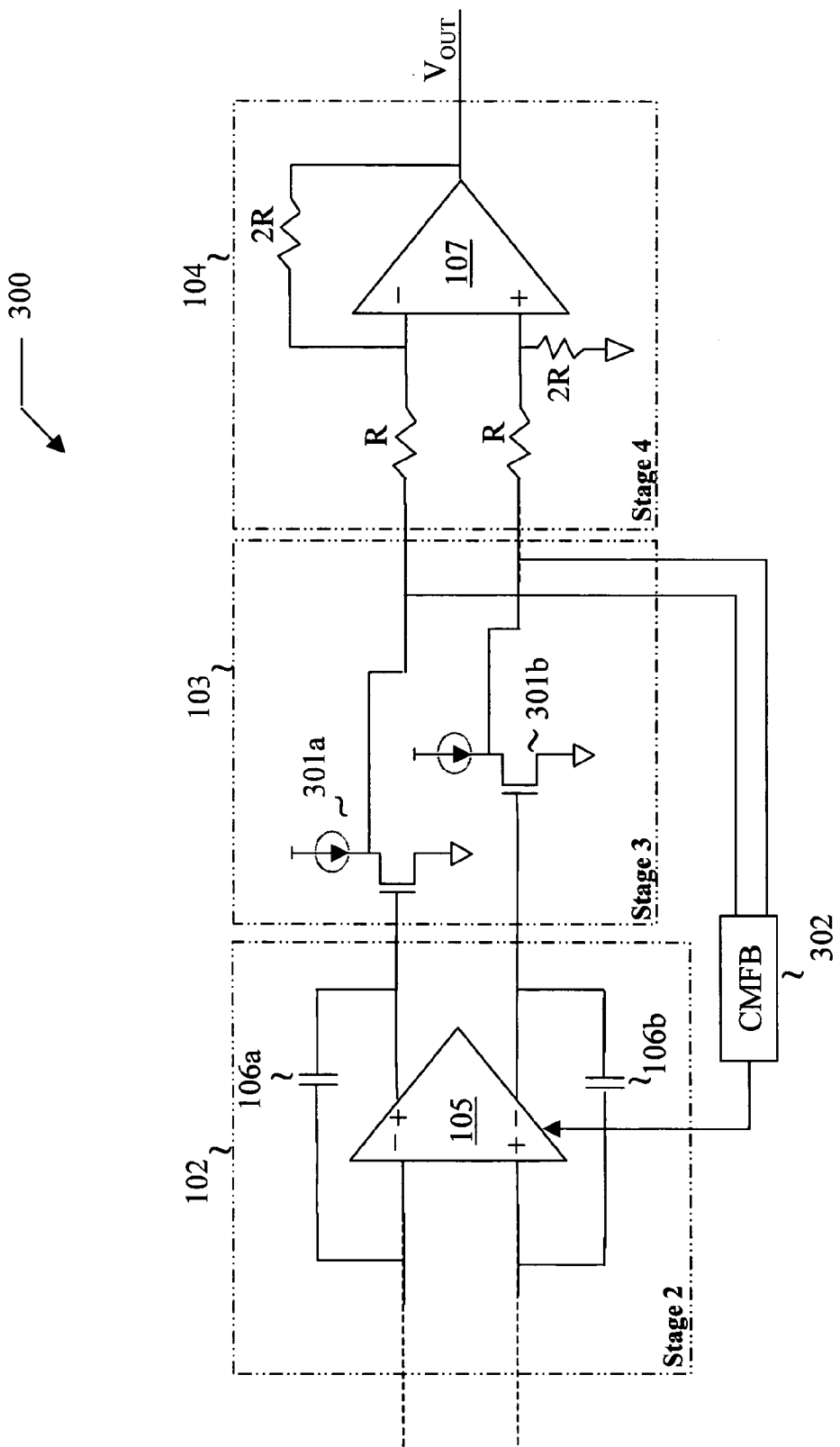
FIG. 3A is a schematic diagram of a portion of the multiple-stage operational amplifier of FIG. 1A, which depicts another exemplary output driver circuit embodying the principles of the present invention.

FIG. 3A illustrates an alternate opamp 300 according to the principles of the present invention. In opamp 300, intermediate stage 103 includes a pair of source follower transistors 301a and 301b couple the differential paths between second gain stage 102 and output driver stage 104. Common mode feedback circuitry 302 varies the common mode voltage of amplifier 105 of second gain stage 102 in response to the output of source follower transistors 301a and 301b.

Advantageously, source follower transistors 301a and 301b provide both high input impedance and a low impedance at the output of the second gain stage 102 and intermediate stage 103 cascade, thereby reducing the loading due to output stage 104. Consequently, lower valued resistors 201a–201b, 202, and/or 205a–205b may be utilized in the embodiments of output stage 104 shown in FIGS. 2A and 2B. Additionally, the voltage swing requirements on the common mode feedback ("CMFB") to second gain stage 102 are also eased.

Figure 3B:
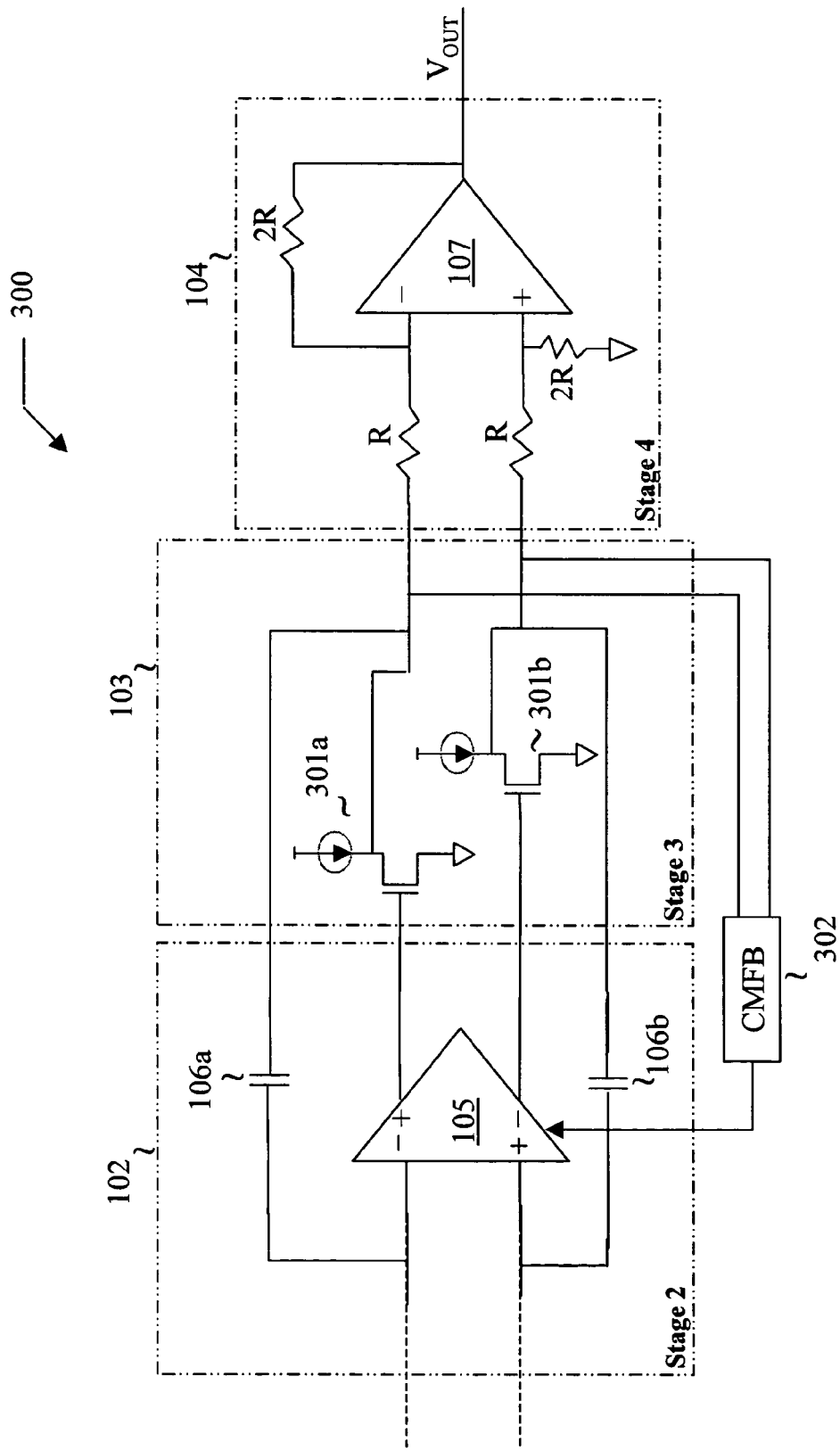
FIG. 3B is a schematic diagram of a portion of the multiple-stage operational amplifier of FIG. 1A, which depicts a further exemplary output driver circuit embodying the principles of the present invention.

FIG. 3B is an electrical schematic diagram illustrating an exemplary embodiment of the principles of the present invention in which Miller compensation capacitors 106a and 106b couple the outputs of second gain stage 102 and the outputs of intermediate stage 103. Compensation capacitors 106a and 106b again implement dominant pole compensation Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A multiple-stage operational amplifier comprising:
   a gain stage for amplifying an input signal and implementing a dominant pole producing a frequency response having a gain roll-off with frequency and a unity gain frequency; and
   an intermediate stage coupled to an output of the gain stage and having a high input impedance and a low output impedance; and
   a low gain output stage coupled to an output of the intermediate stage for driving an output of the operational amplifier and implementing a dominant pole at a frequency substantially higher than the unity gain frequency implemented by the dominant pole implemented by the gain stage.

2. The multiple-stage operational amplifier of claim 1, wherein the output stage comprises a high open loop gain amplifier configured with a resistive network for a low voltage gain greater than about 1.5 and less than about 10.

3. The multiple-stage operational amplifier of claim 1, wherein the output stage performs differential to single-ended signal conversion.

4. The multiple-stage operational amplifier of claim 1, wherein the intermediate stage provides a gain of approximately unity.

5. The multiple-stage operational amplifier of claim 1, further comprising Miller compensation circuitry coupling an input of the gain stage and an input of the intermediate stage.

6. The multiple-stage operational amplifier of claim 1, further comprising Miller compensation circuitry coupling an input of the gain stage and an output of the intermediate stage.

7. The multiple-stage operational amplifier of claim 1, wherein the output stage comprises an amplifier having a selected differential input coupled to a voltage divider between a power supply voltage and ground for setting a common mode voltage of the output stage.

8. The multiple-stage operational amplifier of claim 1, wherein the intermediate stage comprises a source follower coupling an output of the gain stage and an input of the output stage.

9. The multiple-stage operational amplifier of claim 1, wherein the intermediate stage comprises a first source follower coupling a non-inverting output of the gain stage and an inverting input of the intermediate stage and a second source follower coupling an inverting output of the gain stage and a non-inverting input of the output stage.

10. A method of producing an amplified signal using a multiple-stage operational amplifier, comprising:
   amplifying an input signal with an input gain stage implementing a dominant pole producing a frequency response having a gain roll-off with frequency and a unity gain frequency;
   driving an output of the operational amplifier with a low gain output stage implementing a dominant pole at a frequency substantially higher than the unity gain frequency produced by the dominant pole implemented by the input gain stage; and
   isolating the input stage from the output stage with an intermediate stage having a high input impedance and a low output impedance to prevent overloading of the input stage.

11. The method of claim 10, wherein isolating the output stage from the input stage comprises isolating the input and output stages with an intermediate stage having approximately unity gain.

12. The method of claim 10, wherein isolating the output stage from the input stage comprises isolating the input and output stages with an intermediate stage including a source follower transistor isolating an output of the input stage and an input of the output stage.

13. The method of claim 10, wherein the output stage comprises a differential amplifier, and the method further comprises setting a common mode voltage of the output stage with a voltage divider coupled to a selected differential input of the differential amplifier.

14. The method of claim 10, further comprising setting the dominant pole utilizing a Miller compensation circuitry coupling an input of the input stage and an input of the intermediate stage.

15. The method of claim 10, further comprising setting the dominant pole utilizing Miller compensation circuitry coupling an input of the input stage and an output of the intermediate stage.

16. The method of claim 10, wherein driving an output of the operational amplifier with the output stage comprises a high gain amplifier configured to provide low gain.

17. A multiple-stage operational amplifier comprising:
   a first gain stage defining a first dominant pole of a frequency response of the operational amplifier;
   a second gain stage driven by the first gain stage and defining a second dominant pole of the frequency response of the operational amplifier;
   a buffer coupled to an output of the second gain stage and having approximately unity gain, a high input impedance, and a low output impedance; and
   a high gain amplifier configured as low gain output stage driven by the buffer and driving an output of the operational amplifier, the low gain output stage performing differential to single-ended conversion and defining a third dominant pole of the frequency response of the operational amplifier, the third dominant pole being at a frequency sufficiently above the first and second dominant poles to maintain stability of the operational amplifier.

18. The multiple-stage operational amplifier of claim 17, wherein the intermediate stage comprises a source follower transistor coupling an output of the second gain stage and an input of the output stage.

19. The multiple-stage operational amplifier of claim 17, wherein the output stage comprises a differential amplifier including a voltage divider between a power supply rail and ground and coupled to a selected differential input for setting a common mode voltage of the output stage.

20. The multiple-stage operational amplifier of claim 17 further comprising a Miller compensation capacitor coupling an input of the second gain stage and an input of the buffer.

21. The multiple-stage operational amplifier of claim 16, further comprising a Miller compensation capacitor coupling an input of the second gain stage and an output of the buffer.

* * * * *